United States Patent
Aschke et al.

(10) Patent No.: US 7,279,252 B2
(45) Date of Patent: Oct. 9, 2007

(54) SUBSTRATE FOR THE MICRO-LITHOGRAPHY AND PROCESS OF MANUFACTURING THEREOF

(75) Inventors: Lutz Aschke, Mainz (DE); Markus Schweizer, Klein-Winternheim (DE); Jochen Alkemper, Klein-Winternheim (DE); Axel Schindler, Grossbothen (DE); Frank Frost, Leipzig (DE); Thomas Haensel, Naunhof (DE); Renate Fechner, Leipzig (DE)

(73) Assignee: Schott AG, Mainz (DE)

( * ) Notice: Subject to any disclaimer, the term of this patent is extended or adjusted under 35 U.S.C. 154(b) by 513 days.

(21) Appl. No.: 10/753,220

(22) Filed: Jan. 7, 2004

(65) Prior Publication Data

US 2004/0166420 A1 Aug. 26, 2004

(30) Foreign Application Priority Data

Jan. 17, 2003 (DE) ................................ 103 02 342

(51) Int. Cl.
*G03F 1/00* (2006.01)
*G21K 5/00* (2006.01)

(52) U.S. Cl. ............................................ 430/5; 378/35
(58) Field of Classification Search .................... 430/5; 428/428, 430; 378/35
See application file for complete search history.

(56) References Cited

U.S. PATENT DOCUMENTS

| 4,851,372 A | 7/1989 | Lindig et al. |
| 6,159,643 A | 12/2000 | Levinson et al. |
| 6,352,803 B1 | 3/2002 | Tong et al. |
| 6,387,572 B1 | 5/2002 | Tong et al. |
| 2001/0002336 A1 | 5/2001 | Yanagisawa et al. |
| 2003/0057178 A1 | 3/2003 | Goldstein |
| 2004/0063004 A1* | 4/2004 | Alkemper et al. ............. 430/5 |

FOREIGN PATENT DOCUMENTS

| DE | 1 902 432 | 9/1970 |
| WO | WO 02/099818 A1 | 12/2002 |

* cited by examiner

*Primary Examiner*—S. Rosasco
(74) *Attorney, Agent, or Firm*—Harness, Dickey & Pierce, P.L.C.

(57) ABSTRACT

The invention relates to the manufacture of a substrate which is particularly suitable for EUV micro-lithography and comprises a base layer of low coefficient of thermal expansion (CTE) onto which at least one cover layer made of a semiconductor material is applied. Preferably, the cover layer is a silicon layer, preferably applied by ion beam sputtering. By an additional ion beam figuring treatment substrates of extremely accurate shape and extremely low roughness can be prepared.

21 Claims, No Drawings

SUBSTRATE FOR THE MICRO-LITHOGRAPHY AND PROCESS OF MANUFACTURING THEREOF

BACKGROUND OF THE INVENTION

The invention relates to a substrate, in particular for the EUV micro-lithography, the manufacture of such a substrate, as well as to the use of such a substrate for mirrors and/or masks, or mask blanks, respectively, in the EUV micro-lithography.

In the manufacture of integrated circuits the tendency is going towards chips having smaller and smaller structures. Therefore, for producing such chips, lithography systems are necessary that can operate at exposure wavelengths that are becoming smaller and smaller. Currently, wavelengths of 248, 193 and 157 nm are used. For the future, for such lithography systems the application of electromagnetic radiation in the so-called extreme UW region (EUV), in particular in the range of 11 to 14 nm, has been proposed. In this range it will become necessary to leave the transmissive systems common in the prior art and to proceed to reflective systems having reflective optical elements and masks. Up to now, for such reflective systems only few substrates for masks and also for mirrors as well as the related optics that can fulfill the extreme requirements of this technique have been described.

From U.S. Pat. No. 6,159,643 a reflective mask is known that consists of a structured layer and a substrate, wherein the substrate consists of a base layer of a material having a small coefficient of thermal expansion, such as ULE® having a coefficient of expansion of about 0.02 ppm/K, and that is combined with a cover layer of silicon, for instance by an adhesive.

However, with such a substrate the requirements with respect to shape precision and surface roughness of the substrate cannot be met. For instance, for the masks a shape precision of less than 50 nm PV (peak to valley, PV) is required.

Also optical systems based on Zerodur® substrates are known in the art. It was found however in this regard that, although these can be polished with known polishing methods to a surface roughness of 0.1 to 0.3 nm, this surface roughness will be lost during a commonly following treatment step by ion beam figuring (IBF). The surface roughness during this treatment increases by a factor of 2 to 5, if no additional precautions are taken. Since however a surface roughness of less than 0.2 nm rms is desired for substrates for the EUV lithography, the application of such substrates for optical systems suitable for production requires tremendous effort.

Therefore, it is a first object of the invention to provide a process of manufacturing a substrate that is particularly suited for the EUV micro-lithography.

It is a second object of the invention to provide a process of manufacturing a substrate that is simple and cost effective.

It is a third object of the invention to provide a process of manufacturing a substrate for use in the EUV micro-lithography ensuring an extremely high shape precision and low surface roughness.

It is a further object of the invention to provide a component for use in the EUV micro-lithography, such as a mask blank, a mask, a structured mask or a mirror.

SUMMARY OF THE INVENTION

This object is achieved by a process of manufacturing a substrate, in particular for the EUV micro-lithography, comprising the following steps:
  providing a base layer having a coefficient of thermal expansion of no more than 0.1 ppm/K;
  applying a first cover layer of a semiconductor material, preferably consisting of silicon, onto the base layer by a physical or chemical application process, such as by sputtering, by CVD or by PVD;
  finishing the first cover layer.

Further, with respect to the substrate this object is fulfilled by a substrate, in particular for the EUV micro-lithography, comprising a base layer and at least a first cover layer, wherein the base layer consists of a material having a coefficient of thermal expansion of 0.1 ppm/K at the most, wherein the first cover layer consists of a semiconductor material, in particular of silicon, and has been applied onto the base layer by a physical or chemical application process, such as by sputtering, by a CVD process or by a PVD process.

Such a substrate can advantageously be used for producing a mask or an optical element, such as a mirror, for the EUV micro-lithography.

According to the invention, it has been found that the shape precision of the base layer can generally be retained, when directly applying the first cover layer of a semiconductor material, in particular consisting of silicon, by a physical or chemical application process. Simultaneously, it is made possible to obtain the desired low surface roughness of the substrate by means of the cover layer.

DETAILED DESCRIPTION OF THE PREFERRED EMBODIMENTS

Preferably, the cover layer consisting of a semiconductor material, preferably of silicon, is applied directly onto the base layer using ion beam sputtering.

In addition, also other physical or chemical application processes are possible, such as CVD (Chemical Vapor Deposition), in particular PICVD (Plasma Impulse CVD), PACVD (Plasma Assisted CVD), PVD (Physical Vapor Deposition) or, e.g. an application by a sol-gel process.

Glass ceramics such as Zerodur® (SCHOTT Glas), Zerodur-M® (SCHOTT Glas), ClearCeram® (Ohara) and other zero-expansion materials such as ULE® are particularly preferred for the application as masks and/or mirrors for the EUV lithography due to their extremely low thermal expansion and their very good homogeneity.

According to the invention it was found that the disadvantage of materials such as glass ceramics or ceramics, respectively, mentioned above can be avoided by the direct application of a cover layer having a low thermal expansion and comprising a semiconductor material, in particular silicon, onto a base layer, comprising a material of a very low thermal expansion, such as a glass ceramic. In particular, even when the base layer has a worse surface roughness, it is still possible to obtain the surface roughness for the cover layer necessary for the micro-lithography.

The substrate according to the invention comprises a structure comprising at least two layers, consisting of a base layer and a cover layer directly applied thereon.

In this regard, the base layer shall preferably be the layer facing away from the later substrate surface, e.g. the reflecting surface of a mask or of a mirror for the EUV lithography.

As mentioned above, the base layer consists of a material having a very low coefficient of thermal expansion α (or CTE, respectively) of 0.1 ppm/K at the most, preferably of no more than 10 ppb/K. Preferably, this shall be a so-called "close to zero expansion material" basically showing no dimensional change, i.e. a CTE of 10 ppb/K at the most, in a temperature range between −40° C. to +400° C., preferably in a temperature range of 0° C. to 50° C.

Preferably, the base layer of the substrate according to the invention consists of a ceramic, a glass or a glass ceramic. In this regard, in particular the commercially available products Zerodur®, Zerodur-M®, ClearCeram® (Ohara), ULE® or other glass ceramics having a low thermal expansion are suitable. Ceramics that may be used are those ceramics having a coefficient of thermal expansion $\leq 0.1$ ppm/K, such as ceramics containing cordierite or the like.

Glass ceramics are inorganic non porous materials comprising a crystalline phase and a glassy phase.

According to the invention, Zerodur® and variants thereof (e.g. Zerodur-M®) are particularly preferred base layers.

Zerodur® is for instance described in German patent 1,902,432. Zerodur-M® is a Zerodur® composition that basically contains no magnesium, such as e.g. described in U.S. Pat. No. 4,851,372 which is fully incorporated by reference. The characteristics and the composition of Zerodur® and Zerodur-M® are well-known in the art and are for instance described in "Low Thermal Expansion Glass Ceramics", H. Bach (editor), SCHOTT Series on Glass and Glass Ceramics, Science, Technology, and Applications, Springer Verlag which is also incorporated by reference.

The respective glass ceramics consist of glasses of the system $Li_2O—Al_2O_3—SiO_2$ that have been transformed by selective crystallization into glass ceramics comprising high quartz mixed crystals. The manufacture of these glass ceramics is performed in several steps. After melting and hot-forming the material is normally cooled to a temperature below the transition temperature. Thereafter, the base glass is transformed into a glass ceramic article by selective crystallization. This ceramization is performed by an annealing process comprising several steps according to which initially nuclei are formed by nucleation at a temperature normally between 600 and 800° C., commonly using $TiO_2$ or $CrO_2/TiO_2$ mixed crystals as nuclei. During a subsequent temperature increase, high quartz mixed crystals grow on these nuclei at a crystallization temperature of about 750 to 900° C. Herein, the volume fraction between the crystalline high quartz mixed crystal phase and the glassy phase can be controlled such that a coefficient of expansion close to zero results. To this end, normally a ratio of about 80% high quartz mixed crystals and of about 20% residual glass is desired. Since the high quartz mixed crystals have a negative linear thermal expansion in the desired temperature range, while the glassy phase has a positive thermal expansion, a linear coefficient of thermal expansion close to zero can be obtained in a certain temperature range.

Those glass ceramics such as Zerodur® or Zerodur-M® are produced by the applicant on a large scale, wherein large glass blocks consisting of the base glass are ceramized by a selective annealing treatment. Herein, for precision applications such as in the present case a particularly homogenous temperature distribution is maintained, this being the reason why the ceramization process of large blocks of several meters diameter may take several months (for particulars, it is referred to the book "Low Thermal Expansion Glass Ceramics", mentioned above).

The thickness of the base layer is preferably at least 5 mm so that its physical characteristics, in particular its thermal expansion, govern the characteristics of the total system comprising the base and cover layers.

According to the invention, a base layer pretreated by optical polishing is preferably initially treated by an ion beam under a certain ion beam incident angle and with a certain ion beam energy using IBF to obtain the desired shape. For instance, in the production of masks a flatness having a PV deviation of <50 nm (peak to valley deviation) is desired. During IBF treatment the roughness of <0.3 nm rms reached before is deteriorated by a factor of 2 to 3.

Now onto the polished base layer, possibly having been treated by IBF, a cover layer consisting of a semiconductor material, preferably consisting of silicon, is applied directly by a chemical or physical process, preferably by an ion beam sputtering process.

During the IBF process an ion beam is used as a tool for removing a desired thickness of material from the surface. Since the etching rate of the ion beam is small (typically 100 nm/min), this process is only suitable for removing a small thickness of material (a few micrometers at the most). During "Ion Beam Figuring" (IBF) almost single atomic layers are removed by ion bombardment.

During ion beam sputtering the layer thickness can possibly be adjusted locally to improve the shape precision of the substrate.

Herein according to a first embodiment of the process a layer thickness between 500 nm and 2 µm is selected. According to this first embodiment of the process according to the invention subsequently a finishing treatment of the silicon cover layer is again performed using IBF to obtain the desired shape precision and surface roughness.

According to an alternative embodiment of the invention a lacquer planarizing process is performed after IBF treatment and Si coating using an organic lacquer to this end. Herein a further cover layer consisting of an organic lacquer having a thickness between 20 nm and 500 nm is applied, e.g. by spin coating, and, after an annealing process, the lacquer layer is removed by means of ion beam etching (IBF) and is planarized.

According to the second process variant comprising the lacquer planarizing process the first cover layer can be applied with a considerably smaller layer thickness when compared to the first process variant. A layer thickness of about 20 to 50 nm may for instance be sufficient for the Si cover layer, if a subsequent lacquer planarization is performed. Thereby manufacturing cost is considerably reduced when compared to the first process variant.

If for instance a mask substrate shall be produced according to the first production variant, then initially a glass ceramic sample is cut-out from a block, e.g. consisting of Zerodur®, is mechanically treated at its surface, e.g. is ground, and is finally optically polished, until a roughness of $\leq 1$ nm rms, preferably <0.2 nm rms, is reached. A measurement may for instance be performed using AFM on samples of e.g. 10 µm×10 µm or 1 µm×1 µm.

Thereafter, a coating of silicon is applied by ion beam sputtering to a layer thickness between 500 nm and 2 µm. The shape precision of the substrate can be enhanced by locally varying the layer thicknesses.

Thereafter, the coated substrate is treated by IBF to obtain the desired shape precision (PV deviation <50 nm). To this end, it may for instance be worked with Ar ions using an energy between 500 and 1200 EV at an incident angle between 0 and 70°.

In this way masks having the desired PV deviation of <50 nm and a roughness of <0.2 nm can be obtained.

When producing optics (mirrors) according to the first process variant, then the pretreated and polished base layer is initially treated using IBF to obtain the desired shape.

Subsequently, the Si cover layer is applied by ion beam sputtering with a layer thickness of 500 nm to 2 μm which is again treated by IBF to obtain the final shape and to further reduce the roughness.

According to the second process variant the following procedure has been found to be particularly suitable:

In the beginning glass ceramic samples, e.g. consisting of Zerodur®, are cut as described above, are ground and polished to the desired surface roughness of a preferably <0.2 nm rms.

Preferably, subsequently an ion beam figuring IBF is performed initially as described above to obtain the desired shape and surface roughness (mask: PV deviation <50 nm, optical elements (mirrors) <0.3 nm rms).

Thereafter, only a relatively thin Si layer is applied by ion beam sputtering. Herein the layer thickness is between about 20 and 200 nm, preferably between about 20 to 50 nm, an application rate of about 10 to 20 nm/min being sufficient. As mentioned before, the coating can also be used to more fully obtain the substrate flatness. In this case, during the previous IBF treatment only a smaller layer thickness of about 300 nm could be removed, and during the subsequent coating with Si locally between 1 and 100 nm Si could be applied.

The sputtered Si layer is subsequently finished by IBF to meet the shape precision and roughness.

Thereafter, a second cover layer consisting of an organic lacquer is applied, e.g. by spin coating, to a layer thickness of about 20 nm to 200 nm. The lacquer layer is then initially cured by an annealing process. Thereafter, the lacquer layer is fully removed by IBF, whereby the very low roughness is transferred to the silicon layer.

In this way, using Si cover layers of only small thickness surface roughnesses being between 0.1 and 0.2 nm rms are obtained reproducibly.

Instead of the finishing treatment of the base layer and the cover layers, respectively, by IBF, possibly also a magneto-rheologic polishing may be utilized.

As already mentioned above, the substrate according to the invention is suitable for the production of masks for the EUV lithography. For producing such a mask the surface of a substrate according to the invention is coated with a reflecting surface using EUV radiation, thereafter being further processed into a structured mask using known processes. The substrates according to the invention are suitable for the manufacture of unstructured masks, so-called blanks, as well as for the manufacture of structured masks.

The invention relates to mask blanks comprising the substrate according to the invention and a reflecting surface applied thereon, as well as to structured masks, wherein the reflecting surface is structured in a desired way.

In case the substrate according to the invention is used for the manufacture of optical elements such as mirrors for micro-lithography, then a reflective coating is applied onto the substrate according to the invention. Such a mirror may have a planar surface or a curved surface. To produce the mirror with a curved surface, the base layer may be provided in the desired final shape. Thereafter the covering layer(s) and a reflective coating are applied.

What is claimed is:

1. A process of manufacturing a substrate for a component used in EUV micro-lithography, comprising the following steps:
   providing a base layer consisting of a lithium-alumino-silicate glass ceramic having a coefficient of thermal expansion of no more than 0.1 ppm/K between 0° C. and 50° C.;
   polishing said base layer to a surface roughness of one nanometer rms at the most;
   applying a first cover layer consisting of silicon onto said base layer by ion beam sputtering up to a layer thickness between 20 nanometers and 200 nanometers;
   treating said first cover layer by a method selected from the group formed by ion beam figuring (IBF) and by magneto-rheologic polishing;
   applying a second cover layer comprising an organic lacquer up to a layer thickness between 20 and 200 nanometers;
   curing said second cover layer;
   at least partially removing said second cover layer by a method selected from the group formed by IBF and by magneto-rheologic polishing until a desired surface characteristic is reached.

2. The process of claim 1, further comprising the step of applying a reflective coating onto a top surface of said substrate.

3. The process of claim 1, further comprising the step of structuring said reflective coating.

4. The process of claim 1, wherein said base layer is treated by a method selected from the group formed by IBF and by magneto-rheologic polishing, before said first cover layer is applied.

5. The process of claim 1, wherein said second cover layer is applied by spin coating.

6. A process of manufacturing a substrate for a component used in EUV micro-lithography, comprising the following steps:
   providing a base layer consisting of a lithium-alumino-silicate glass ceramic having a coefficient of thermal expansion of no more than 0.1 ppm/K between 0° C. and 50° C.;
   polishing said base layer to a surface roughness of one nanometer rms at the most;
   applying a first cover layer consisting of silicon onto said base layer by ion beam sputtering up to a layer thickness between 500 nanometers and 2000 nanometers;
   treating said first cover layer by a method selected from the group formed by IBF and by magneto-rheologic polishing, until a desired surface characteristic is reached.

7. The process of claim 6, further comprising the step of applying a reflective coating onto a top surface of said substrate.

8. The process of claim 6, further comprising the step of structuring said reflective coating.

9. The process of claim 6, wherein said base layer is treated by a method selected from the group formed by IBF and by magneto-rheologic polishing, before said first cover layer is applied.

10. A process of manufacturing a substrate. comrrising the following sters:
   providing a base layer having a coefficient of thermal expansion of no more than 0.1 ppm/K;
   applying a first cover layer of a semiconductor material onto said base layer; and finishing said first cover layer until a desired surface characteristic is reached;

wherein said first cover layer is treated by a process selected from the group formed by IBF and magneto-rheologic polishing until a shape precision of less than 50 nanometers PV is reached.

11. The process of claim 10, further comprising the step of applying a second cover layer comprising a lacquer onto said first cover layer.

12. The process of claim 11, wherein said second cover layer is applied by spin coating.

13. The process of claim 11, wherein said second cover layer is applied with a layer thickness of 20 nanometers to 500 nanometers.

14. The process of claim 11, wherein said second cover layer is cured and is subsequently at least partially removed.

15. The process of claim 11, wherein said second cover layer is treated by a process selected from the group formed by IBF and magneto-rheologic polishing until a shape precision of less than 50 nanometers PV is reached.

16. The process of claim 11, wherein said first cover layer is treated by a process selected from the group formed by IBF and magneto-rheologic polishing until a surface roughness of less than 0.2 nanometers rms is reached.

17. The process of claim 10, wherein said base layer is polished to a surface roughness of less than 1 nanometer rms, before said first cover layer is applied.

18. The process of claim 10, wherein said base layer is polished to a surface roughness of less than 0.2 rms, before said first cover layer is applied.

19. The process of claim 10, wherein said base layer comprises a material having a coefficient of thermal expansion CTE $\leqq 0.01$ ppm/K in a temperature range of 0° C. to 50° C.

20. The process of claim 10, wherein said base layer comprises a material selected from the group formed by a glass ceramic and a ceramic comprising cordierite.

21. The process of claim 10, wherein said base layer comprises a material selected from the group formed by Zerodur®, Zerodur-M®, ULE® and ClearCeram®.

* * * * *